United States Patent [19]

Elbicki

[11] Patent Number: 4,806,858

[45] Date of Patent: Feb. 21, 1989

[54] LIQUID CRYSTAL NONDESTRUCTIVE INSPECTION OF MAGNETIZATION AND VARIATIONS IN MAGNETIZATION OF HIGH ENERGY MAGNETS

[76] Inventor: Janean M. Elbicki, 1764 Rose St., Lower Burrell, Pa. 15068

[21] Appl. No.: 76,039

[22] Filed: Jul. 21, 1987

[51] Int. Cl.$^4$ .................... G01N 27/74; G01R 33/12; G02F 1/13

[52] U.S. Cl. .................................. 324/205; 324/226; 324/262; 350/331 R

[58] Field of Search ............... 324/205, 214, 215, 262, 324/226; 350/331 R, 351, 330, 376

[56] References Cited

U.S. PATENT DOCUMENTS 4,668,916  5/1987  Pech ..................................... 324/216

Primary Examiner—Reinhard J. Eisenzopf
Assistant Examiner—Walter E. Snow

[57] ABSTRACT

A method for coupling liquid crystals and a magnetic field to monitor changes in local magnetic properties (e.g., direction of magnetization) is provided. A magneto-optical sensor is used to detect and observe inhomogenieties, impurity phases, of a high energy magnet by monitoring the response of liquid crystals to a magnetic and/or electric field applied perpendicular or antiparallel to the magnetic field supplied by the magnet. The intensity of field necessary to cause a rotation of the liquid crystals in the direction of the applied field, and hence a modification of the optical properties of the liquid crystals, can be used as a rapid, inexpensive quality control test for batch magnet fabrication. The method can be applied to both thin films and bulk specimens. The magnetically weak spots of the sample can be mapped out by noting the appearance of dark and light regions as the liquid crystals are rotated into positions which obscure the illuminating light. Pleochroic dyes, which are long, cylindrically-shaped molecules containing chromophoric groups, can be used to increase the contrast and thus sensitivity of the method since the angle formed between the path of illuminating light and the axis of the pleochroic material determines the color reflected.

8 Claims, 2 Drawing Sheets

THE APPLIED FIELD SWITCHES THE 90° TWIST INTO A HEMOTROPIC STRUCTURE.
THE ARROWS REPRESENT THE TRANSMISSION AXES OF THE POLARIZERS.

LIQUID CRYSTAL NONDESTRUCTIVE INSPECTION OF MAGNETIZATION AND VARIATIONS IN MAGNETIZATION OF HIGH ENERGY MAGNETS

DESCRIPTION

BACKGROUND OF THE INVENTION

Conventional methods used to study fine details of magnetic materials include the Bitter Method (as first suggested by Bitter, F. in Phys. Rev. 38, 1903 (1931) and Von Hamos, L. and Thiessen, P. A., Z. Physik 77, 442 (1931)) and Lorentz microscopy (Cullity, B. D., "Introduction to Magnetic Materials"; Addison-Wesley Publishing Company, Reading, Mass., 1972, p. 292). They can only be used to observe domain walls. Individual domains, which are magnetic regions in which the direction of magnetization is uniform, look similar using these methods. A major disadvantage of the Bitter method is the need of a lengthy specimen preparation, which involves mechanical polishing and electropolishing of the surface before application of a colloidal $Fe_3O_4$ suspension (recipes for the preparation of a colloidal suspension of magnetite are given by Elmore, W. C., Phys. Rev. 54, 309 (1938) and Kittel, C. and Galt, J. K., Solid State Phys. 3, 439 (1956)). A limitation of Lorentz microscopy is the requirement that the sample must be very thin, approximately 1000 Å or less, to transmit electrons. Additionally, an electron microscope equipped for Lorentz microscopy represents a very substantial capital investment.

The Kerr and Faraday Effects are common techniques used in the study of magnetic materials (Morrish, A. H., "The Physical Principles of Magnetism," Robert E. Krieger Publishing Company, Malabar, Fla., 1983, p. 374). They can distinguish one domain from another but supply no information about the domain walls. The Kerr Effect involves the rotation of the plane of polarization of a light beam during reflection from a magnetized sample. Since the amount of rotation is much less than one degree, the method is not easy to apply. In the Faraday Effect, the plane of polarization of a light beam is rotated as it is transmitted through the magnetized sample. This technique is therefore limited to very thin samples which can transmit light. In many materials including those in this disclosure, the Faraday Effect is not applicable because the sample does not transmit light. In both of these techniques (i.e., Kerr and Faraday Effects), the magnet interacts directly with the light beam to generate an observable effect.

While the above techniques are useful, none is a fast, inexpensive technique suitable for studying essential details of the process of magnetization reversal, i.e., change in direction of magnetization of domains, which is essential in characterizing magnetic materials in both bulk and thin film form.

Coercivity is a very important magnetic property of a permanent magnet. It describes the magnet's resistance to magnetization reversal, i.e., the change in direction of magnetization by 180°. Coercivity is often a significant factor in determining the commercial value of a permanent magnet. In many cases coercivity of the material of which the magnet is constructed is controlled by impurities which are magnetically soft and not desired. Magnetization reversal occurs preferentially at these soft spots and subsequently may spread throughout the entire material. Thus the existence of these impurity soft spots is linked to the utility of the magnet. A rapid, inexpensive, non-destructive method for observing these soft spots would be very desirable. No existing techniques have all these attributes.

It is known that a liquid crystal (or a liquid crystal/pleochroic dye combination) can be oriented by a magnetic field. Priestley, E. B.; Wojtowicz, P. J.; Sheng, P. in "Introduction to Liquid Crystals"; Plenum Press, N.J., 1975, p. 115 report that about 1 oe of magnetic field is the equivalent of about 1 volt/cm of electric field in orienting liquid crystals. Further, it is known that orientation of liquid crystals can be detected optically. This has been shown by many people such as: Creagh, L. T.; Kmetz, A. R.; Reynolds, R. A., "Performance Characteristics of Nematic Liquid Crystal Display Devices," IEEE Trans. Electron Devices, p. 672 (1971) and Heilmeier, G. H.; Zanoni Applied Physics Letters, Vol. 13, No. 3, 1968, p. 91.

Permanent magnets are usually fabricated by batch processes. The yield is less than 100%, i.e., not all batches lead to a successful product. A rapid, inexpensive technique to assay a sample magnet from a batch would enable one during processing to make compositional adjustments, modify processing parameters, etc., and thus increase yield. The present invention is a method for rapid, inexpensive assaying of permanent magnet materials.

A method is provided to use (liquid crystals or liquid crystals/pleochroic dyes) and polarized light to detect and quantify the soft spots in the magnetic material as it is processed. To applicant's knowledge, there are no existing methods which use the interaction between polarized light and (liquid crystals or liquid crystals/pleochroic dyes) to study magnetic properties, i.e., coercivity, saturation magnetization and magnetization reversal of magnets.

BRIEF DESCRIPTION OF THE INVENTION

The invention is directed to a method for detecting magnetically weak or soft spots in a high energy magnet. More particularly, the method comprises subjecting a magnet plus a liquid crystal array to an electric and/or magnetic field applied either perpendicular or antiparallel to the field supplied by said magnet. The strong region of the magnet is observed to orient liquid crystals, said orientation being detected optically. When an opposing or antiparallel magnetic and/or electric field is applied, magnetization of the sample changes by 180° at the soft spots but generally not in the hard bulk material because of its strong magnetic field. This 180° change in magnetization is detected optically. If the external fields are applied perpendicular to the field of the magnet, magnetization rotates at the soft spots by 90°. Either reorientation of the liquid crystals gives a detectable optical effect antiparallel means running parallel but in a contrary direction.

DETAILED DESCRIPTION OF THE INVENTION

Liquid crystals are comprised of molecules containing multiple double bonds along their long axis, one or more benzene rings, and polar or long chain terminal groups. The dimensions of the liquid crystals can vary depending on side groups attached to the major axis of the molecule. Liquid crystals are diamagnetic and prefer to align with the plane of their benzene rings parallel to a magnetic field. (Dorfman, Y. G. "Diamagnetism and Chemical Bond"; American Elsevier Publishing Company Inc.: New York, 1965, p. 12). This occurs because this is a lower energy state.

Typical liquid crystals which can be employed include:

| Type | Name (Common Abbreviation) |
|---|---|
| Smectic | Cyanobenzylidene octyl oxyanilin (CBOOA) |
| | Terephthal-bis(-p-butylaniline) (TBBA) |
| | p-decycloxy benzylidene |
| | p'amino 2-methylbutyl cinnamate |
| Nematic | p-azoxyanisole (PAA) |
| | N—(p-methoxybenzylidene)-p-butylaniline (MBBA) |
| | 4-ethoxybenzylidene-4'cyano aniline (PEBAB) |
| | p-n-butoxy benzoic acid |
| | phenyl-cyclohexane type |
| | biphenyl type |
| | Schiff's base type |
| Cholesteric | Cholesterol |
| | Cholesterol acetate |
| | Poly(γ-benzyl glutamate) |
| | Cholesteryl oleate |
| | Cholesteryl oleyl carbonate |

Pleochroic dyes, which are long, cylindrically shaped molecules containing chromophoric groups, can be added to the liquid crystals. They will move in conjunction with the liquid crystals. An important property of these dyes is they reflect light differently depending on the angle of the radiating light in respect to their major axes. If the electric vector of a polarized light source is parallel to the long axis of the molecule, the color characteristic of the dye is seen. When the long axes of these dyes are perpendicular to the electric vector of the incident light a resulting decrease in the optical density occurs which is accompanied by the disappearance of color. Thus the direction of alignment of the liquid crystal/pleochroic dye combination can be detected optically through the observation of a color change. This alignment can be modified magnetically. Hence the liquid crystal/pleochroic dye combination can be used to sense direction of magnetization and magnetization reversal.

Typical pleochroic dyes which can be employed include: Indophenol Blue, N-N'-Dipalmitoylindigo, Isolar Green M, 4-Nitrobenzylidenephenylhydrazone, N-N'-Dimethylindigo and methyl red.

Typical magnets include $SmCO_5$, $PrCO_5$, $Nd_2Fe_{14}B$ and $Pr_2Co_{17}$.

Figure 1:
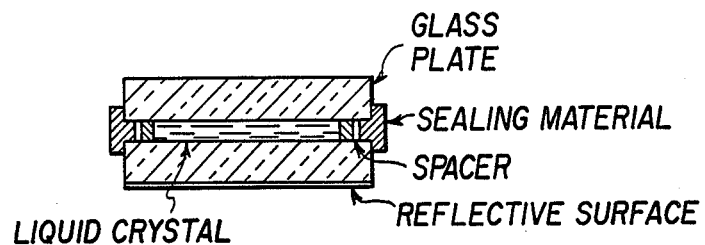
FIG. 1 is a side view of a liquid crystal sandwich type cell.

The basic components of this method include: a liquid crystal sandwich type cell, sample magnet, source of external magnetic and/or electric field, and an optical microscope. The liquid crystal sandwich type cell is constructed in a conventional way. It consists (see FIG. 1) of two glass sides with polarizers which are separated by non-conductive spacers made of Teflon, Mylar, glass frits, or the like. The liquid crystals or liquid crystal/pleochroic dye medium will fill the volume created by the glass slides, spacers and appropriate sealing material. The polarizers are not shown because the number and positioning of them depends on the type of liquid crystals being used. In the case of twisted nematic liquid crystals, one polarizer is placed on the top glass slide while a second polarizer is cross-aligned at 90° on the bottom glass plate. In the case of the liquid crystal/pleochroic dye combination only one polarizer is required. It is positioned on top of the top glass slide. Typical sealing materials are solder glasses, polymeric materials or glass frits. A reflective surface such as a mirror will be placed below the bottom glass slide. The liquid crystals will be uniformly oriented by aligning solutions such as tertiary amines (Petrie, S. E.; Bucher, H. K.; Klingbiel, R. T. and Rose, P. I., Organic Chemical Bulletin 45, No. 2 (1973), Eastman Kodak Co., Rochester, N.Y.), hexadecyltrimethylammoniumbromide (Haller, I.; Huggins, H. A., U.S. Pat. No. 3,656,834, Apr. 18, 1972), and silane coupling agents (Kahn, F. J., App. Phys. Lett. 22, p. 386 (1973)) or general aligning procedure such as described in Zocher, H., and Coper, K., Z. Phys. Chem., 132, p. 195 (1928) before the sample is tested.

Figure 2:
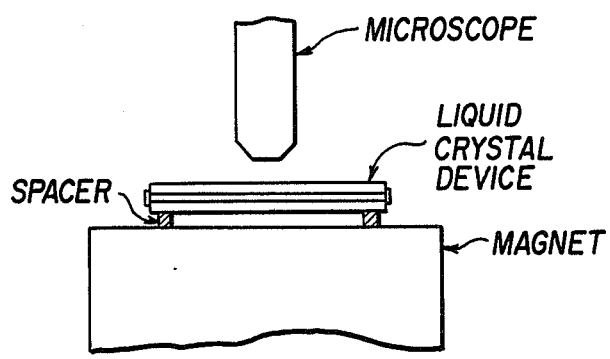
FIG. 2 is a side view of a liquid crystal sandwich in operational position to a magnet and a microscope.
Figure 3:
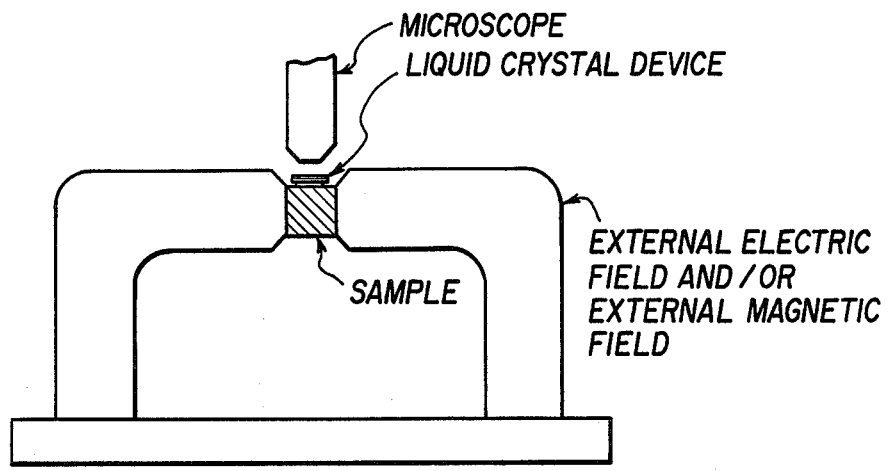
FIG. 3 is a side view of a liquid crystal sandwich in operational relationship to an external electric or magnetic field.

The liquid crystal sandwich cell can be placed on or near the test magnet. The distance will be optimized using spacers as shown in FIG. 2. Some of the liquid crystals will be reoriented by the sample's magnetic field. The sandwich cell can be observed with an optical microscope as an external field applied perpendicular or antiparallel to the field of the sample (FIG. 3) is gradually increased. Soft spots will be detected by the alteration in color of the pleochroic dyes. The rate of magnetization reversal with increasing external field will readily be observed by observing with the microscope the changes in optical properties of the sandwich cell.

An example of a suitable liquid crystal/pleochroic dye pair is p-azoxyanisole and methyl red. Methyl red displays a gradual color change from red to colorless with various degrees of color from orange to yellow as the electric vector of the polarized light source changes from a parallel to a perpendicular position in relation to its long axis. One can therefore see the magnetization reversal take place through the same degrees of movement.

The above procedure can also be done using liquid crystals without pleochroic dyes. In that case, black, white and gray regions will be visible depending on the position of the liquid crystals in the sandwich cell. Changes in the color of the regions with the application of an external electric and/or magnetic field is the important festive, enabling magnetic inhomogeneities to be detected.

Figure 4:
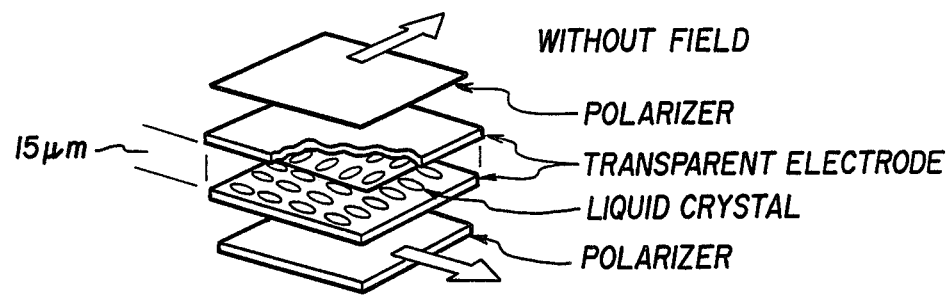
FIG. 4 is a side view of a twisted nematic liquid crystal display.
Figure 4:
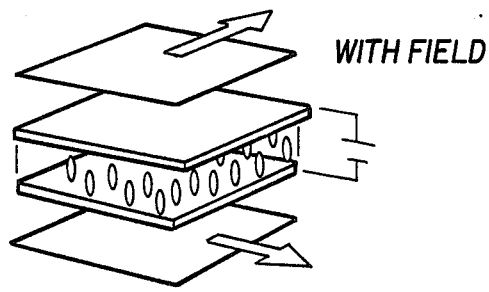

FIG. 4 is a side view of a twisted nematic liquid crystal display as taught by Bylander, E. G. "Electronic Displays—Texas Instruments Electronica Series"; McGraw-Hill: New York, 1979, p. 138. In this type of device, the mesophase material is preferentially aligned on the top plate and then cross-aligned at 90° with respect to the bottom plate. The polarized light will be rotated 90 degrees in passing normally through the cell. Application of a field destroys the rotation by tipping the molecules.

It is important to align the liquid crystals 90° from one another at each plate so that the effect of the magnetic field may be detected. When light passes through the first polarizer, it becomes plane polarized light as shown by the top arrow in FIG. 4. If the twisted nematic is undisturbed, it will rotate the light by 90° so it can pass through the second polarizer. The light will then impinge on a mirror which will reflect it back through the polarizers and a bright spot will appear on the display. If the liquid crystals lose their ability to rotate the plane of the light, the light passing through the first polarizer will be blocked by the second polarizer. These regions will appear dark on the display. A strong magnetic field can unwind the twisted nematic to form the rod shape pure nematic. They will align parallel with the field without rotating the light.

The weight ratio of the dye to liquid crystal will depend on the materials employed but generally will be between about 0.001 and about 1.0.

The nematic type liquid crystals are preferred because they are generally more chemically and thermally stable. Their length/width ratio will generally be between about 10 and about 10,000.

The field applied will depend upon the materials employed but generally will be between about 500 and 1300 Oe for a magnetic field and between about 0.5 and 10.0 V/cm for an electric field.

While standard temperature and pressure conditions will be generally sufficient, higher temperatures up to about 200° C. may be used to induce faster response of the liquid crystals.

I claim:

1. A method of detecting variations in magnetization in a high energy magnet which comprises subjecting the magnet to be studied and liquid crystals held in close proximity to said magnet to an electric and/or magnetic field applied perpendicular or antiparallel to the field of said magnet whereby the liquid crystals are reoriented and observing variations in said field strength of said magnet.

2. The method of claim 1 which an electric and/or a magnetic field applied antiparallel to the field of said magnet is used instead of an electric and/or a magnetic field applied perpendicular to the field of said magnet.

3. The method of claim 1 wherein pleochroic dyes are used in conjunction with said liquid crystals to increase resolution.

4. The method of claim 2 wherein pleochroic dyes are used in conjunction with said liquid crystals to increase resolution.

5. The method of claim 1 wherein the liquid crystals are of the nematic type.

6. The method of claim 1 wherein the liquid crystals have a length/width ratio of between about 10 and about 10,000.

7. The method of claim 1 wherein the liquid crystals are maintained at a temperature between about 20° C. and about 200° C.

8. The method of claim 1 wherein the liquid crystals are of the nematic type, placed between first and second transparent slides, some of which crystals are cross-aligned at 90° with respect to the other, light is passed through a first polarizer and the crystals and then impinged on a second polarizer which is cross-aligned with the first polarizer and polarized light from said second polarizer which is 90° out of phase with the initial polarized light is reflected back to the first slide.

* * * * *